United States Patent
Teo et al.

(10) Patent No.: US 11,846,836 B2
(45) Date of Patent: Dec. 19, 2023

(54) THIN-FILM ELECTRO-OPTICAL WAVEGUIDE MODULATOR DEVICE

(71) Applicant: Applied Materials, Inc., Santa Clara, CA (US)

(72) Inventors: Russell Chin Yee Teo, Palo Alto, CA (US); Ludovic Godet, Sunnyvale, CA (US); Nir Yahav, Sunnyvale, CA (US); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 90 days.

(21) Appl. No.: 17/306,853

(22) Filed: May 3, 2021

(65) Prior Publication Data

US 2021/0405399 A1 Dec. 30, 2021

Related U.S. Application Data

(60) Provisional application No. 63/045,044, filed on Jun. 27, 2020.

(51) Int. Cl.
*G02F 1/035* (2006.01)
*C30B 1/02* (2006.01)
*C30B 29/32* (2006.01)

(52) U.S. Cl.
CPC .............. *G02F 1/035* (2013.01); *C30B 1/02* (2013.01); *C30B 29/32* (2013.01)

(58) Field of Classification Search
CPC ........... G02F 1/035; C30B 1/02; C30B 29/32; C30B 23/025
See application file for complete search history.

(56) References Cited

U.S. PATENT DOCUMENTS

| | | |
|---|---|---|
| 7,898,730 B2 | 3/2011 | Wessels et al. |
| 11,391,891 B2 * | 7/2022 | Kumar ................ G02B 6/2935 |
| 2003/0017700 A1 | 1/2003 | Was et al. |
| 2012/0155824 A1 | 6/2012 | Suzuki et al. |

(Continued)

OTHER PUBLICATIONS

P T Lin, Z Liu, and B W Wessels, Ferroelectric thin film photonic crystal waveguide and its electro-optic properties, Journal of Optics A: Pure and Applied Optics, vol. 11, No. 7, p. 075005, May 2009.<https://iopscience.iop.org/article/10.1088/1464-4258/11/7/075005>.

(Continued)

*Primary Examiner* — John Bedtelyon
(74) *Attorney, Agent, or Firm* — PATTERSON & SHERIDAN, LLP

(57) ABSTRACT

An electro-optical waveguide modulator device includes a seed layer on a substrate, the seed layer having a first crystallographic plane aligned with a surface of the seed layer, an electro-optical channel extending in a first direction on the seed layer and having a second crystallographic plane aligned with the surface of the seed layer, an insulator layer on both sides of the electro-optical channel on the substrate in a second direction perpendicular to the first direction, an electrode barrier layer on the electro-optical channel and the insulator layer, and one or more of electrodes extending in the second direction. The seed layer and the insulator layer each comprise material having a refractive index that is lower than the electro-optical channel.

13 Claims, 3 Drawing Sheets

(56) References Cited

U.S. PATENT DOCUMENTS

2016/0027938 A1   1/2016   Stoica et al.
2016/0313579 A1   10/2016  Yokoyama et al.
2019/0384073 A1*  12/2019  Yu ..................... G02B 6/12004

OTHER PUBLICATIONS

M. Pan and C. A. Randall, "A brief introduction to ceramic capacitors," IEEE Electrical Insulation Magazine, vol. 26, No. 3, pp. 44-50, May-Jun. 2010. <https://ieeexplore.ieee.org/document/5482787>.

Wen-Ching Shih, Yuan-Sung Liang, and Mu-Shiang Wu, "Preparation of BaTiO3 Films on Si Substrate with MgO Buffer Layer by RF Magnetron Sputtering," Japanese Journal of Applied Physics, vol. 47, No. 9S, p. 7475, Sep. 19, 2008 <https://iopscience.iop.org/article/10.1143/JJAP.47.7475>.

Sangsub Kim and Shunichi Hishita, "Preparation and Characterization of BaTiO3 Thin Films on MgO-buffered Si(100) Substrates by RF Sputtering," vol. 12, Issue 4, pp. 1152-1159, Apr. 1997 <https://www.cambridge.org/core/journals/journal-of-materials-research/article/preparation-and-characterization-of-batio3-thin-films-on-mgobuffered-si100-substrates-by-rf-sputtering/40A29647916A73B00AD7DD8692DF7381>.

S. Kaneko, H. Funakubo, T. Kadowaki, Y. Hirabayashi, and K. Akiyama, "Cubic-on-cubic growth of a MgO(001) thin film prepared on Si(001) substrate at low ambient pressure by the sputtering method," EPL (Europhysics Letters), vol. 81, No. 4, p. 46001, Jan. 10, 2008 https://iopscience.iop.org/article/10.1209/0295-5075/81/46001 <https://urldefense.com/v3/_https://iopscience.iop.org/article/10.1209/0295-5075/81/46001_;!!NH8t9uXaRvxizNEf!DELIxC1BFGudJxXRJF6RLWnwtnkMf5b8Ng45xfqOyXXzqWeVYhxUaNblSo709_np$>.

Hiroshi Nomura, Ari Ide?Ektessabi, Nobuto Yasui, and Yuji Tsukuda, "Ion Beam Processing and Analysis of MgO Thin Films," AIP Conference Proceedings 680, 613 (2003); <https://doi.org/10.1063/1.1619791>.

Appl Phys A (2008) 93: 579-587 Film growth mechanisms in pulsed laser deposition.

Siming Wang, C. Antonakos, C. Bordel, D. S. Bouma, P. Fischer, and F. Hellman, "Ultrathin IBAD MgO films for epitaxial growth on amorphous substrates and sub-50?nm membranes," Appl. Phys. Lett. 109, 191603 (2016).

International Search Report dated Aug. 20, 2021 for Application No. PCT/US2021/030418.

* cited by examiner

THIN-FILM ELECTRO-OPTICAL WAVEGUIDE MODULATOR DEVICE

CROSS-REFERENCE TO RELATED APPLICATIONS

This application claims priority to U.S. Provisional Patent Application Ser. No. 63/045,044, filed on Jun. 27, 2020, which is incorporated by reference herein.

BACKGROUND

Field

Embodiments of the present disclosure generally relate to electro-optical devices, and more specifically, to thin-film electro-optical waveguide modulator devices integrated in a silicon platform.

Description of the Related Art

Silicon photonics has become a platform for dense and low-cost integrated photonic circuits for a wide range of applications. Adding an electro-optical (EO) material, such as barium titanate ($BaTiO_3$, BTO) to silicon photonics enables a number of novel active photonic devices, such as modulators and switches, that could reduce power consumption and increase operation speed. Electro-optical devices integrated in a silicon platform, including electro-optical (EO) waveguide phase modulators, can also be key elements in emerging quantum technologies such as all-optical quantum computing using a single photon source and a single photon detector.

However, the development of architectures for integrated electro-optical devices that are scalable and replicable remains a missing element for progress of near-future quantum technologies.

SUMMARY

Embodiments of the present disclosure generally relate to an electro-optical waveguide modulator device. The electro-optical device includes a seed layer on a substrate, the seed layer having a first crystallographic plane aligned with a surface of the seed layer, an electro-optical channel extending in a first direction on the seed layer and having a second crystallographic plane aligned with the surface of the seed layer, an insulator layer on both sides of the electro-optical channel on the substrate in a second direction perpendicular to the first direction, an electrode barrier layer on the electro-optical channel and the insulator layer, and one or more of electrodes extending in the second direction. The seed layer and the insulator layer each comprise material having a refractive index that is lower than the electro-optical channel.

Embodiments of the present disclosure also relate to a method of forming a substrate having a crystallographically aligned surface. The method includes depositing a seed layer on a substrate through a process selected from an ion beam assisted deposition process and a pulsed laser deposition process, and annealing the deposited seed layer to align a first crystallographic plane of the seed layer with a surface of the seed layer.

Embodiments of the present disclosure further relate to a method of forming an electro-optical waveguide modulator device. The method includes depositing a seed layer on a substrate through a process selected from an ion beam assisted deposition process and a pulsed laser deposition process, annealing the deposited seed layer to align a first crystallographic plane of the seed layer with a surface of the seed layer, depositing a layer of an electro-optical material on the seed layer, annealing the deposited layer of the electro-optical material to align a second crystallographic plane of the layer of the electro-optical material with the surface of the seed layer, and patterning the layer of the electro-optical material to form an electro-optical channel extending in a first direction on the seed layer. The seed layer comprises material having a refractive index that is lower than the electro-optical channel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to electro-optical (EO) devices, and more specifically, to thin-film electro-optical (EO) waveguide modulator devices integrated in a silicon platform.

In the embodiments described herein, thin film electro-optical (EO) waveguide phase modulators integrated in a silicon platform are of high quality having an EO material with crystallographic orientations aligned such that the EO material has a high electro-optic coefficient (e.g., Pockel Coefficient>700 pm/V), leading to high sensitivity to an applied electric field. The alignment of crystallographic orientations of the EO material and an underlying seed layer formed on a substrate is performed by annealing processes, such as a laser anneal process, at high temperatures as crystallographic orientations of the EO material and the seed layer as deposited are not aligned. The anneal processes are performed without breaking vacuum while the substrate is transferred between a pre-clean chamber for pre-cleaning the substrate and a process chamber for depositing the EO material and/or the seed layer.

Such thin film electrode waveguide phase modulators can have different refractive indices depending on the strength of an applied electric field to modulate phases of incident light, and thus, when combined with optical fibers, or single photon sources and single photon detectors, can be used as enabling elements in the next generation optical communications and quantum technologies.

Conventionally, electro-optical (EO) devices are fabricated on bulk lithium niobate (LiNbO$_3$) single crystals and are combined with other optical and electronic components due to their ability to be grown as large and high quality single crystals. Recent developments towards integrated and compact optical systems on silicon call for fabrication and characterization of thin film optical and electro-optical (EO) components (e.g., waveguides, sources, modulators, and detectors) with ferroelectric oxide materials having much higher electro-optic coefficients, such as barium titanate (BaTiO$_3$, BTO), than LiNbO$_3$. In the embodiments described herein, examples of thin film electro-optical (EO) waveguide phase modulators formed on a silicon based platform are described. However, the present disclosure is not limited to use in this particular application and can be applied to other thin film electro-optical (EO) components.

Figure 1:
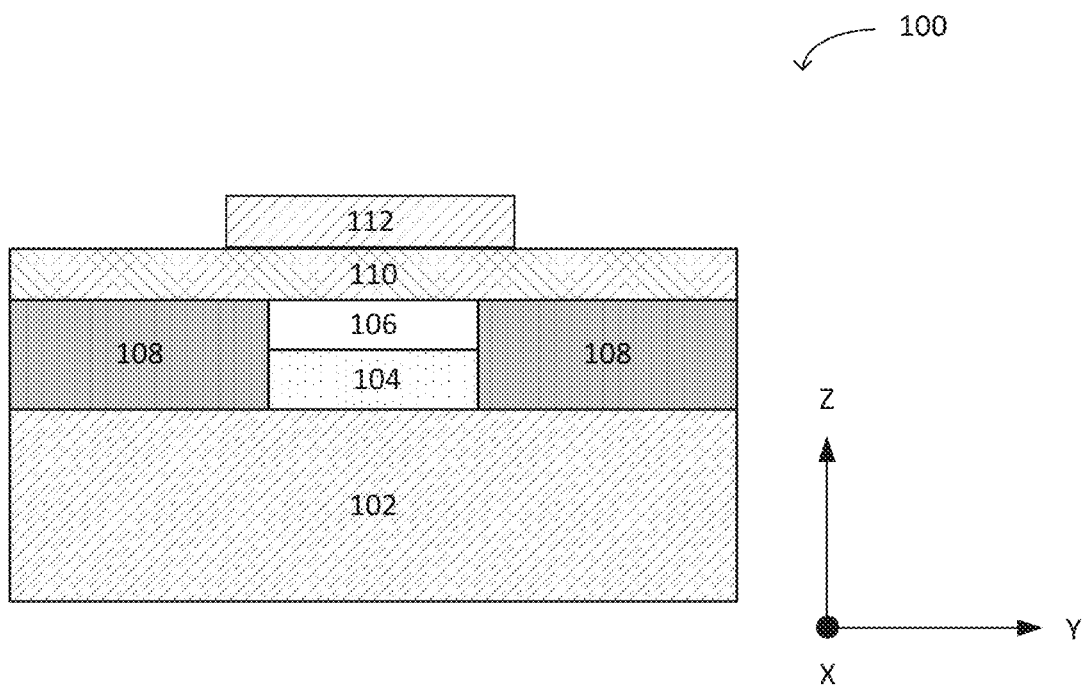
FIG. 1 is a schematic diagram of an electro-optical (EO) waveguide modulator according to one embodiment.
Figure 2:
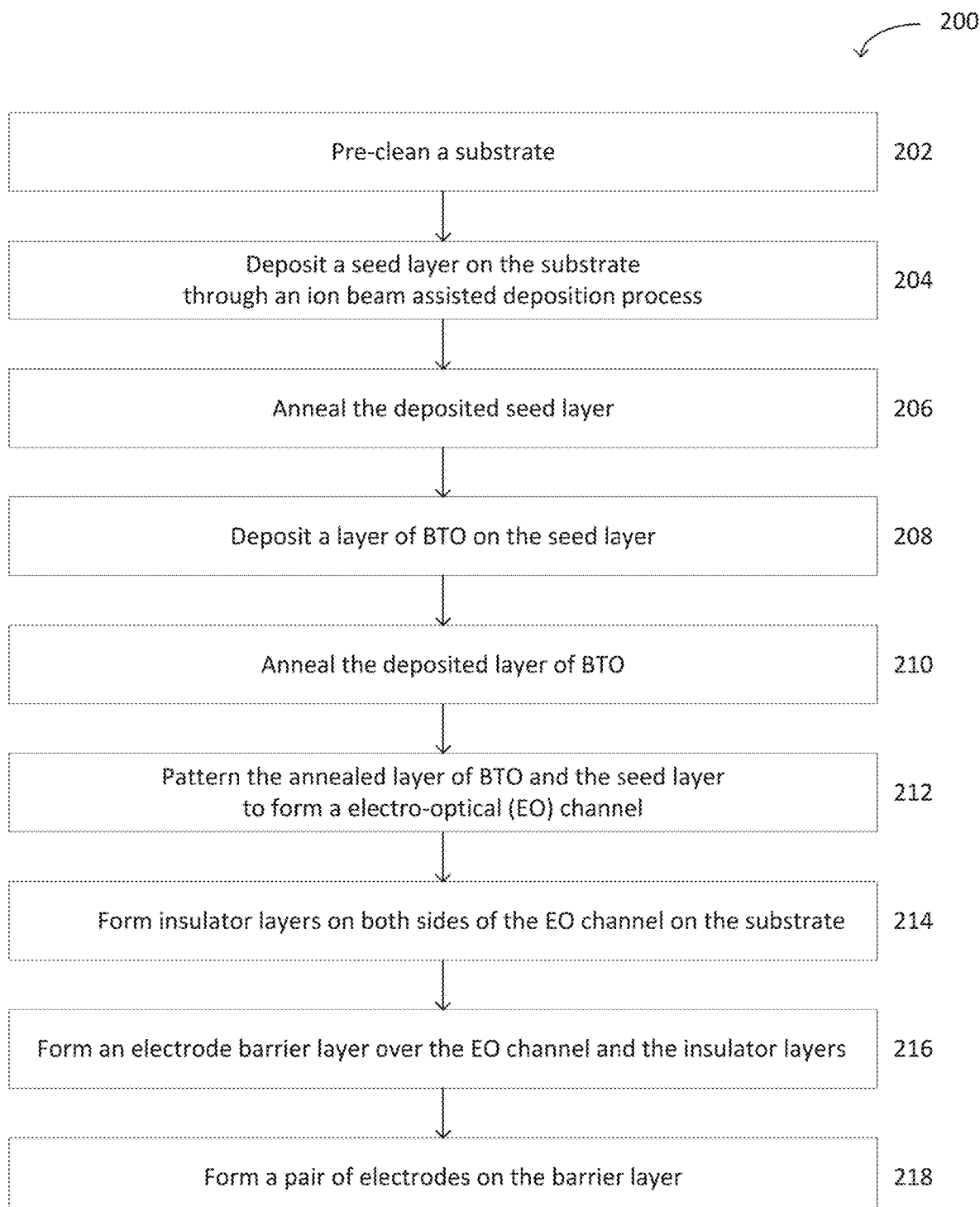
FIG. 2 illustrates a flow diagram of a processing sequence used to fabricate an EO waveguide according to one embodiment.

FIG. 1 is a schematic diagram of an electro-optical (EO) waveguide modulator 100 according to one or more embodiments. FIG. 2 illustrates a flow diagram of a processing sequence 200 used to fabricate an EO waveguide modulator 100 according to one or more embodiments. The processing sequence 200 to fabricate the EO waveguide modulator 100 on a substrate 102 are performed in a substrate processing system, such as a cluster tool 300 described below in conjunction with FIG. 3.

As used herein, the term "substrate" refers to a layer of material that serves as a basis for subsequent processing operations and includes a surface to be disposed for forming the EO waveguide modulator 100 thereon. The substrate 102 may be a (001) silicon wafer, silicon oxide, strained silicon, silicon germanium, doped or undoped polysilicon, doped or undoped silicon wafers, patterned or non-patterned wafers silicon on insulator (SOI), carbon doped silicon oxides, silicon nitride, indium phosphide, germanium, gallium arsenide, gallium nitride, quartz, fused silica, glass, or sapphire. Moreover, the substrate 102 is not limited to any particular size or shape. The substrate 102 can be a round wafer having a 200 mm diameter, a 300 mm diameter or other diameters, such as 450 mm, among others. The substrate 102 can also be any polygonal, square, rectangular, curved or otherwise non-circular workpiece, such as a polygonal glass substrate.

In block 202 of the processing sequence 200, a surface of the substrate 102 is pre-cleaned to remove native oxides or other sources of contaminants prior to fabricating the EO waveguide modulator 100 thereon. For example, the substrate 102 may be pre-cleaned by a wet etch process using a dilute hydrofluoric acid (dHF) etching solution at a temperature between about 24° C. and about 50° C. Alternatively, the substrate 102 may be pre-cleaned by a vapor etch process in a pre-clean chamber, such as a SICONI™ chamber, which is available from Applied Materials, Inc., Santa Clara, Calif. The pre-clean gas may be a mixture of nitrogen (N$_2$) and hydrogen (H$_2$) gases. A purge gas or carrier gas, such as argon (Ar), can also be added to the pre-clean gas mixture.

The EO waveguide modulator 100 includes a seed layer 104 formed on the substrate 102. The seed layer 104 is formed of magnesium oxide (or magnesia, MgO) in the X-Y plane and has a thickness in the Z-direction of between about 0.25 nm and about 15 nm. The seed layer 104 is formed to have the (001) crystallographic plane parallel to the X-Y plane that is aligned with the crystallographic plane of the underlying substrate 102 (e.g., (001) silicon wafer). In some embodiments, the seed layer 104 is formed by depositing MgO on the pre-cleaned substrate 102 by a physical vapor deposition (PVD) process with a plasma based on a mixture gas including argon (Ar) and oxygen (02) gases at room temperature, in which a target housed in the PVD chamber is comprised of MgO. In block 204 of the processing sequence 200, the seed layer 104 is formed by other chemical deposition processes, such as a chemical vapor deposition (CVD) process, metal organic chemical vapor deposition (MOCVD), an atomic layer deposition (ALD) process, or a molecular beam epitaxy (MBE) process. However, the seed layer 104 as deposited may include multiple domains of crystallites of varying sizes and crystallographic orientations, such as (200), (220), and (222) of the body-centered cubic (BCC) or the face-centered cubic (FCC) crystal lattice structure, and is thus further treated such that the seed layer 104 includes larger domains of MgO crystallites having a (001) crystallographic plane parallel to the X-Y plane. For example, MgO may be further deposited on the substrate 102 through an ion beam assisted deposition (IBAD) process. In an IBAD process, as MgO is deposited, MgO is simultaneously etched by a beam of high energy (about 300 eV and about 2000 eV) ions such as argon ions (Ar$^+$) or oxygen ions (0+) depending on the crystallographic orientations of the MgO crystallites. When an ion beam is incident at a 45° angle with respect to the surface of the seed layer 104 (i.e., the X-Y plane), crystallites having a (001) crystallographic plane (out-of-plane to the ion beam) and a (101) crystallographic plane (in-plane and parallel to the ion beam) are preferentially formed while crystallites having other planes are removed. In some embodiments, the seed layer 104 is formed via a pulsed laser deposition (PLD) process.

In block 206 of the processing sequence 200, the seed layer 104 may be further annealed to recreate crystalline structures from domains that are not yet aligned with the crystallographic plane (001), by a laser anneal process, a rapid thermal anneal (RTA) process, a furnace anneal process, or an anneal process in a vacuum anneal chamber. In the laser anneal process, the surface of the seed layer 104 is irradiated in an atmosphere containing oxygen (O$_2$), hydrogen (H$_2$), and nitrogen (N$_2$) with a purge gas or carrier gas, such as argon (Ar), for a duration of between about 0.1 seconds and about 24 hours at a temperature of between about 700° C. and about 1100° C. at atmospheric pressure. In the RTA process, the anneal process lasts for a duration of between about 0.1 seconds and about 24 hours in an atmosphere containing oxygen (O$_2$), hydrogen (H$_2$), and nitrogen (N$_2$) with a purge gas or carrier gas, such as argon (Ar) at a temperature of between about 200° C. and about 1000° C. at a high vacuum pressure. The anneal process may be a furnace anneal in a rapid thermal processing (RTP) chamber, in which the seed layer 104 is heated to a temperature of between about 200° C. and about 1000° C. in an atmosphere containing oxygen (O$_2$), hydrogen (H$_2$), and nitrogen (N$_2$) with a purge gas or carrier gas, such as argon (Ar) for between about 0.1 seconds and about 24 hours at a high vacuum. The anneal process may be performed in a vacuum anneal or high pressure chamber at a temperature of about 1000° C. for a time duration of between about 5 minutes and about 90 minutes with a purge gas or carrier gas, such as argon (Ar).

In another embodiment, which can be combined with other embodiments described herein, the deposition process in block 204 and the anneal process in block 206 are repeated until a desired thickness of the seed layer 104 having a desired domain size of MgO crystallites having crystallographic plane (001) is achieved.

The EO waveguide modulator 100 further includes an EO channel 106 formed in the X-direction on the (001) crystallographic plane of the seed layer 104. The EO channel 106 defines a waveguide region of the EO waveguide modulator 100. The EO channel 106 is formed of material exhibiting a Pockels effect (also referred to as linear EO effect) that changes the refractive index proportionally to an electric field applied to the material. In some embodiments, the EO channel 106 is formed of barium titanate ($BaTiO_3$, BTO) with the c-axis of BTO oriented in the Z-direction. Bulk BTO has the largest Pockels coefficient (>1000 pm/V) among well-known materials. The EO channel 106 has a width in the Y-direction of between about 4 nm and about 500 nm, and a thickness in the Z-direction of between about 100 nm and about 300 nm. The EO channel 106 is fabricated by forming a layer of BTO on the seed layer 104 and patterning the layer of BTO on the seed layer 104. In block 208 of the processing sequence 200, the layer of BTO may be formed by deposition processes, such as a PVD process, a CVD process, or an ALD process, or epitaxially grown. In block 210 of the processing sequence 200, the layer of BTO as deposited may be annealed, substantially similarly to the annealing processes in block 206, to form large domains of BTO crystallites having a (001) crystallographic plane in the X-Y plane (i.e., the c-axis along the Z-axis). In some embodiments, the EO channel 106 is formed of barium strontium titanate ($BaO_4SrTi$, BSTO). In another embodiment, which can be combined with other embodiments described herein, the deposition process in block 208 and the anneal process in block 210 are repeated until a desired thickness of the seed layer 104 having a desired domain size of BTO crystallites having crystallographic plane (001) is achieved.

In block 212 of the processing sequence 200, the layer of BTO along with the underling seed layer 104 is etched to form the EO channel 106.

The lattice mismatch between cubic MgO (a=4.2313 Å at 300 K) and tetragonal BTO (a=3.992 Å, c=4.036 Å, at 300 K) is quite large. However, MgO is often used as the seed layer 104 for its low refractive index (about 1.7 at 1.55 μm wavelength) and optical transparency. The seed layer 104 optically separates the EO channel 106 from an underlying silicon substrate 102, as the low refractive index of the seed layer 104 (that is lower than the refractive index of the EO channel 106, which is about 2.3 when no electric field applied at 1.55 μm wavelength) insures confinement of light in the Z-direction within the EO channel 106.

In some embodiments, the seed layer 104 is formed of strontium titanate ($SrTiO_3$, STO), and the EO channel 106 is formed of lanthanum titanate ($La_2Ti_2O_7$, LTO).

The EO waveguide modulator 100 further includes insulator layers 108 on the substrate 102 on both sides of the EO channel 106 in the X-direction. The insulator layers 108 may be formed of dielectric material having low refractive index, such as silicon oxide ($SiO_2$, refractive index of about 1.4 at 1.55 μm wavelength), silicon nitride ($Si_3N_4$, refractive index of about 2.0 at 1.55 μm wavelength), low-k, ultra-low-k, or extreme-low-k dielectric materials, SiCH, SiCNH, SiCONH, black diamond, porous or airgap materials. In block 214 of the processing sequence 200, the insulator layers 108 are formed by depositing a blanket layer of the dielectric material on the exposed surface of the seed layer 104 and the EO channel 106 by deposition processes, such as a PVD process, a CVD process, or an ALD process, and subsequently partially etching back or chemically polishing the blanket layer of the dielectric material, such that the EO channel 106 is exposed and planarized with the insulator layers 108.

Over the EO channel 106 and the insulator layers 108, the EO waveguide modulator 100 further includes an electrode barrier layer 110. The electrode barrier layer 110 is formed of material selected from tantalum nitride (TaN), titanium nitride (TiN), titanium (Ti), and tantalum oxide ($Ta_2O_5$). The barrier layer 110 has a thickness in the Z-direction of between about 0.25 nm and about 15 nm. In block 216 of the processing sequence 200, the electrode barrier layer 110 may be formed by deposition processes, such as a PVD process, a CVD process, or an ALD process.

The EO waveguide modulator 100 further includes one or more of coplanar electrodes 112 extending in the Y-direction formed on the sides of the EO channel 106. The electrodes 112 are formed of nickel (Ni), tungsten (W), ruthenium (Ru), aluminum (Al), molybdenum (Mo), copper (Cu), or cobalt (Co). Each of the electrodes 112 has a width in the Y-direction of between about 0.4 nm and about 500 nm, and a thickness in the Z-direction between about 1 nm and about 1000 nm, for example, about 100 nm. When a DC or low-frequency voltage is applied to the electrodes 112, the refractive index of the EO channel 106 changes, resulting in modulation of phase of light propagating through the waveguide region of the EO channel 106. In block 218 of the processing sequence 200, the electrodes 112 are formed by depositing a layer of metal such as nickel (Ni), tungsten (W), ruthenium (Ru), aluminum (Al), molybdenum (Mo), copper (Cu), or cobalt (Co) by deposition processes, such as a PVD process, a CVD process, or an ALD process, patterning the deposited layer of metal. The electrodes 112 may be annealed, substantially similarly to the annealing processes in block 206.

Figure 3:
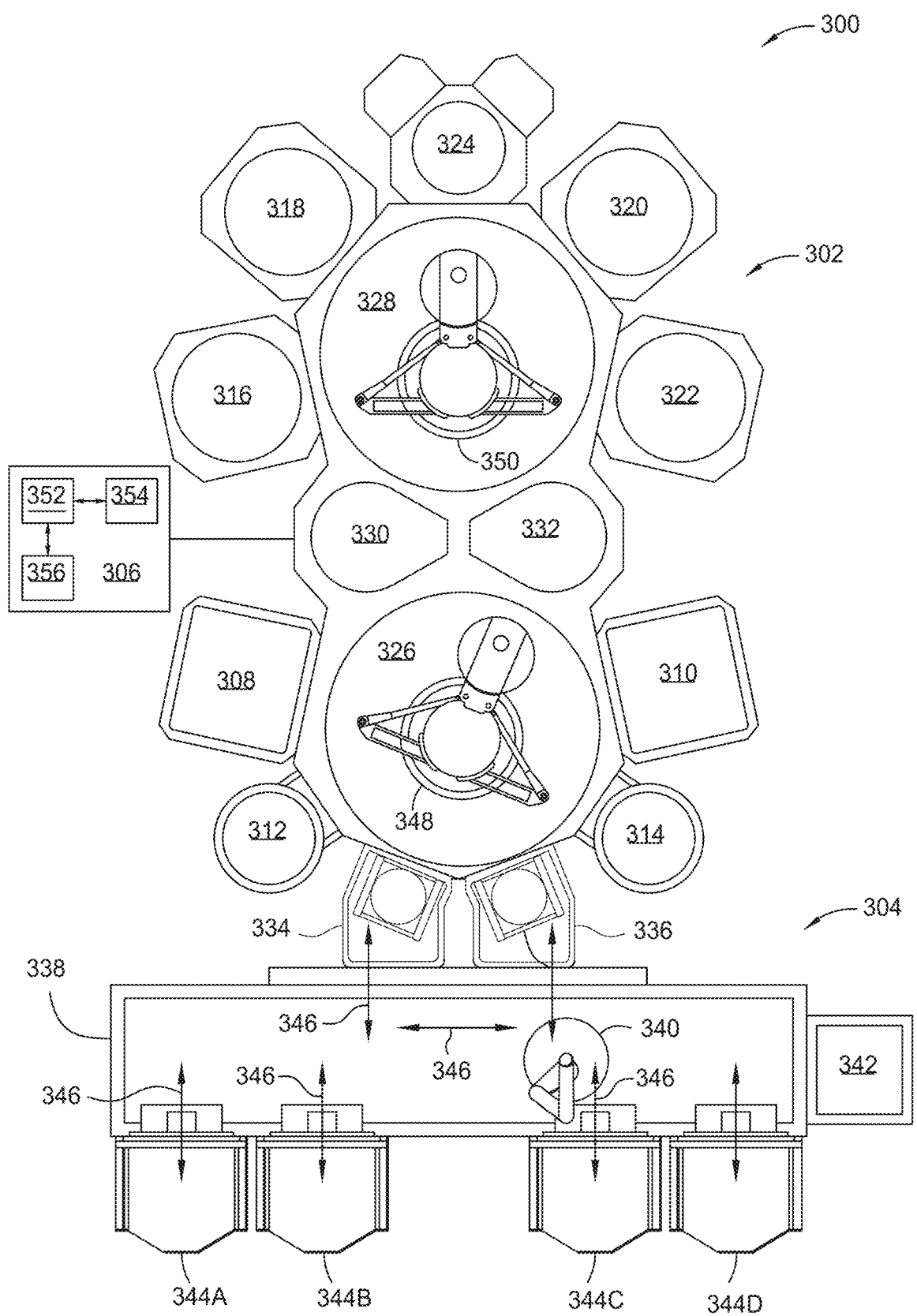
FIG. 3 is a schematic diagram of a substrate processing system according to one embodiment.

FIG. 3 illustrates a substrate processing system 300 in which the EO waveguide modulator 100 may be fabricated according to one or more embodiments. Examples of the substrate processing system 300 are the ENDURA® system and the Centura® system, commercially available from Applied Materials, Inc. of Santa Clara, Calif. Alternatively, other substrate processing systems may be also be modified in accordance with the present disclosure.

The substrate processing system 300 includes a vacuum-tight processing platform 302, a factory interface 304, and a controller 306. Further, the substrate processing system 300 may also be referred to as a cluster tool or multi-chamber processing system.

The processing platform 302 includes one or more processing chambers. For example, the processing platform 302 may include processing chambers 308, 310, 312, 314, 316, 318, 320, 322, 324. Further, the processing platform 302 includes one or more transfer chambers. For example, as is illustrated in FIG. 3, the processing platform 302 includes transfer chambers 326, 328. The processing platform 302 may also include one or more pass-through chambers that allow a substrate to be transferred between transfer chambers. For example, pass-through chambers 330, 332 may allow a substrate to be transferred between the transfer chambers 326 and 328.

The processing platform 302 may also include one or more load lock chambers. For example, as is illustrated in FIG. 3, the processing platform 302 includes load lock chambers 334, 336. The load lock chambers 334, 336 may be pumped down to be operated under a vacuum before transferring substrates from the factory interface 304 to the transfer chamber 326.

The factory interface 304 includes one or more docking stations 338, one or more factory interface robots 340, and a charging station 342. The docking stations 338 include one or more front opening unified pods (FOUPs) 344A, 344B, 344C, 344D. The factory interface robot 340 may be capable of linear and rotational movement illustrated by arrows 346. Further, the factory interface robot 340 may transfer substrates between the FOUPs 344A-D, the load lock chambers 334, 336, and the charging station 342. The substrate may be transferred by the factory interface robot 340 from the charging station 342 to one or more of the load lock chambers 334, 336 for processing the substrate within the processing platform 302. Subsequently, the processed substrate may be transferred from the load lock chambers 334, 336 to one of the FOUPs 344A-D by the factory interface robot 340.

The transfer chamber 326 includes a transfer robot 348. The transfer robot 348 transfers substrates to and from the load lock chambers 334, 336 to and from the processing chambers 308, 310, 312, 314, and to and from pass-through chambers 330, 332. The pass-through chambers 330 and 332 may be utilized to maintain vacuum conditions while allowing substrates to be transferred within the processing platform 302 between the transfer chambers 326 and 328. The transfer chamber 328 includes a transfer robot 350. The transfer robot 350 transfers substrates between the pass-through chambers 330, 332 and the processing chambers 316, 318, 320, 322, 324, and among the processing chambers 316, 318, 320, 320, 322, 324.

The processing chambers 308, 310, 312, 314, 316, 318, 320, 322, 324 may be configured in any manner suitable to process a substrate. For example, the processing chambers 308, 310, 312, 314, 316, 318, 320, 322, 324 may be configured to deposit one or more material layers and apply one or more cleaning processes to a substrate.

The processing chambers, e.g., the processing chambers 308, 310, 312, 314 may be configured to perform a pre-clean process to eliminate contaminants and/or degas volatile components from a substrate prior to transferring the substrate into another process chamber. The processing chamber 322 may be configured to deposit one or more layers on a substrate. Further, the processing chamber 324 may be configured to position a mask (e.g., a shadow mask) on a substrate before the substrate is transferred to one or more of the processing chambers 316, 318, 320, 322 and unload a mask from a substrate after processing within one or more of the processing chambers 316, 318, 320, 322. The processing chambers 316, 318, 320, 322 may be configured to deposit materials using a deposition process such as chemical vapor deposition (CVD), atomic layer deposition (ALD), metalorganic chemical vapor deposition (MOCVD), plasma-enhanced chemical vapor deposition (PECVD), and physical vapor deposition (PVD) (e.g., sputtering process or evaporation process), among others. The processing chambers 316, 318, 320 can be Rapid Thermal Annealing (RTA) chambers, or Rapid Thermal Process (RTP) chambers, that can anneal substrates at vacuum or near vacuum pressures. An example of an RTA chamber is a RADIANCE™ chamber, commercially available from Applied Materials, Inc., Santa Clara, Calif. Alternatively, the processing chambers 316, 318, 320 can be W×Z™ deposition chambers capable of performing high temperature CVD deposition, annealing processes, or in situ deposition and annealing processes.

The controller 306 is configured to control the components of the substrate processing system 300. The controller 306 may be any suitable controller for controlling the operation of one or more of the processing chambers 308, 310, 312, 314, 316, 318, 320, 322, 324, the transfer chambers 326 and 328, pass-through chambers 330, 332, and the factory interface 304. For example, the controller 306 may be configured to control the operation of the transfer robot 348, the transfer robot 350, and the factory interface robot 340. The controller 306 includes a central processing unit (CPU) 352, a memory 354, and support circuits 356. The CPU 352 may be any general purpose computer processor that may be utilized in an industrial environment. The support circuits 356 are coupled to the CPU 352 and may include cache, clock circuits, input/output subsystems, power supplies and the like. Software routines may be stored within the memory 354. The software routines may be executed by the CPU 352 and thus be adapted to cause various components within the substrate processing system 300 to perform one or more of the methods described herein. Alternatively, or additionally, one or more of the software routines may be executed by a second CPU (not illustrated). The second CPU may be part of the controller 306 or remote from the controller 306.

One or more processing chambers 308, 310, 312, 314, 316, 318, 320, 322, 324, one or more transfer chambers 326 and 328, one or more pass-through chambers 330, 332, and/or the factory interface 304 may have a dedicated controller or controllers (not shown) configured to control at least a portion of the methods disclosed herein. The dedicated controllers may be configured similar to the controller 306 and may be coupled with the controller 306 to synchronize processing of a substrate within the substrate processing system 300.

In the embodiments described herein, thin film electro-optical (EO) waveguide phase modulators integrated in a silicon platform are of high quality having an electro-optical material with crystallographic orientations aligned. Such thin film electrode waveguide phase modulators, when combined with optical fibers, or single photon sources and single photon detectors, can be used as enabling elements in the next generation optical communications and quantum technologies.

While the foregoing is directed to embodiments of the present disclosure, other and further embodiments of the disclosure may be devised without departing from the basic scope thereof, and the scope thereof is determined by the claims that follow.

What is claimed is:

1. An electro-optical waveguide modulator device, comprising:
   a seed layer directly on a surface of a substrate, which has a first crystallographic orientation, the seed layer having a first crystallographic plane aligned with a surface of the seed layer and the first crystallographic orientation of the surface of the substrate;
   an electro-optical channel extending in a first direction on the seed layer and having a second crystallographic plane aligned with the surface of the seed layer;
   an insulator layer on both sides of the electro-optical channel on the substrate in a second direction perpendicular to the first direction;
   an electrode barrier layer on the electro-optical channel and the insulator layer; and
   one or more of electrodes extending in the second direction, wherein
   the seed layer and the insulator layer each comprise material having a refractive index that is lower than the electro-optical channel.

2. The electro-optical waveguide modulator device according to claim 1, wherein the seed layer comprises magnesium oxide (MgO) having (001) crystallographic plane aligned with the surface of the seed layer.

3. The electro-optical waveguide modulator device according to claim 2, wherein the electro-optical channel comprises material selected from barium titanate ($BaTiO_3$) and barium strontium titanate ($BaO_4SrTi$, BSTO) having (001) crystallographic plane aligned with the surface of the seed layer.

4. The electro-optical waveguide modulator device according to claim 1, wherein the seed layer has a thickness of between about 0.25 nm and about 5 nm.

5. The electro-optical waveguide modulator device according to claim 1, wherein the electro-optical channel has a width in the second direction of between about 4 nm and about 500 nm, and a thickness of between about 100 nm and about 300 nm.

6. The electro-optical waveguide modulator device according to claim 1, wherein the seed layer comprises strontium titanate ($SrTiO_3$).

7. The electro-optical waveguide modulator device according to claim 1, wherein the electro-optical channel comprises lanthanum titanate ($La_2Ti_2O_7$).

8. The electro-optical waveguide modulator device according to claim 1, wherein the one or more of electrodes are directly on the electrode barrier layer and over the electro-optical channel.

9. The electro-optical waveguide modulator device according to claim 8, wherein the electro-optical channel comprises a material that is configured to change its refractive index when an electric field is created by applying an electrical bias voltage to the one or more of electrodes.

10. The electro-optical waveguide modulator device according to claim 1, wherein the electrode barrier layer comprises one of tantalum nitride (TaN), titanium nitride (TiN), titanium (Ti), and/or tantalum oxide ($Ta_2O_5$).

11. The electro-optical waveguide modulator device according to claim 1, wherein:
the substrate comprises silicon,
the first crystallographic orientation is aligned with the (001) crystallographic plane, and
the seed layer comprises magnesium oxide (MgO) having (001) crystallographic plane aligned with the surface of the seed layer.

12. The electro-optical waveguide modulator device according to claim 11, wherein the electro-optical channel comprises material selected from barium titanate ($BaTiO_3$) and barium strontium titanate ($BaO_4SrTi$, BSTO) having (001) crystallographic plane aligned with the surface of the seed layer.

13. The electro-optical waveguide modulator device according to claim 12, wherein the one or more of electrodes are directly on the electrode barrier layer and over the electro-optical channel.

* * * * *